United States Patent
Pickrell et al.

(10) Patent No.: US 7,767,480 B1
(45) Date of Patent: Aug. 3, 2010

(54) METHOD FOR SEMICONDUCTOR COMPOSITIONAL GRADING TO REALIZE LOW-RESISTANCE, DISTRIBUTED BRAGG REFLECTORS

(75) Inventors: Gregory Pickrell, Carson City, NV (US); Duane A. Louderback, Zephyr Cove, NV (US); Peter Guilfoyle, Zephyr Cove, NV (US)

(73) Assignee: Opticomp Corporation, Zephyr Cove, NV (US)

( * ) Notice: Subject to any disclaimer, the term of this patent is extended or adjusted under 35 U.S.C. 154(b) by 1138 days.

(21) Appl. No.: 11/063,230

(22) Filed: Feb. 22, 2005

Related U.S. Application Data

(60) Provisional application No. 60/548,502, filed on Feb. 26, 2004.

(51) Int. Cl.
H01L 21/00 (2006.01)

(52) U.S. Cl. .................. 438/37; 438/29; 257/E33.072; 257/E33.069; 257/E51.021

(58) Field of Classification Search .................. 257/98, 257/191, E33.072, E33.069, E51.021; 438/27, 438/29–32, 37; 117/84
See application file for complete search history.

(56) References Cited

U.S. PATENT DOCUMENTS

| | | | | | |
|---|---|---|---|---|---|
| 4,833,101 | A | * | 5/1989 | Fujii | 117/105 |
| 4,944,246 | A | * | 7/1990 | Tanaka et al. | 118/729 |
| 5,379,719 | A | * | 1/1995 | Chalmers et al. | 117/105 |
| 5,568,499 | A | * | 10/1996 | Lear | 372/45.01 |

OTHER PUBLICATIONS

K. Tai, L. Yang, Y.H. Wang, J.D. Wynn, and A.Y. Cho, "Drastic reduction of series resistance in doped semiconductor distributed Bragg reflectors for surface-emitting lasers," Appl. Phys. Lett., vol. 56, No. 25, pp. 2496-2498, Jun. 18, 1990.

P. Zhou, J. Cheng, C.F. Schaus, S.Z. Sun, K. Zheng, E. Armour, C. Hains, W. Hsin, D.R. Myers, and G.A Vawter, "Low series resistance high-efficiency GaAs/AlGaAs vertical-cavity surface-emitting lasers with continuously graded mirrors grown by MOCVD," IEEE Phot. Tech. Lett., vol. 3, No. 7, pp. 591-593, Jul. 1991.

S.A. Chalmers, K.L. Lear, and K.P. Killeen, "Low resistance wavelength-reproducible p-type (Al,Ga)As distributed Bragg reflectors grown by molecular beam epitaxy," Appl. Phys. Lett., vol. 62, No. 14, pp. 1585-1587, Apr. 5, 1993.

M.G. Peters, B.J. Thibeault, D.B. Young, J.W. Scott, F.H. Peters, A.C. Gossard, and L.A. Coldren, "Band-gap engineered digital alloy interfaces for lower resistance vertical-cavity surface-emitting lasers," Appl. Phys. Lett., vol. 63, No. 25, pp. 3411-3413, Dec. 20, 1993.

(Continued)

*Primary Examiner*—Davienne Monbleau
*Assistant Examiner*—Matthew Reames
(74) *Attorney, Agent, or Firm*—DLA Piper LLP (US)

(57) ABSTRACT

A method of manufacturing a distributed Bragg reflector (DBR) in group III-V semiconductor compounds with improved optical and electrical characteristics is provided. A selected DBR structure is achieved by sequential exposure of a substrate to predetermined combinations of the elemental sources to produce a pair of DBR layers of compound alloys and a graded region including one or more discrete additional layers between the DBR layers of intermediate alloy composition. Exposure durations and combinations of the elemental sources in each exposure are predetermined by DBR design characteristics.

79 Claims, 5 Drawing Sheets

OTHER PUBLICATIONS

B. Lu, P. Zhou, J. Cheng, K.J. Malloy, and J.C. Zolper, "High temperature pulsed and continuous-wave operation and thermally stable threshold characteristics of vertical-cavity surface-emitting lasers grown by metalorganic chemical vapor deposition," Appl. Lett., vol. 65, No. 11, pp. 1337-1339, Sep. 12, 1994.

P. Zhou, B. Lu, J. Cheng, K.J. Malloy, S.Z. Sun, S.D. Hersee, and J.C. Zolper, "Vertical-cavity surface-emitting lasers with thermally stable electrical characteristics," J. Appl. Phys., vol. 77, No. 6, pp. 2264-2267, Mar. 15, 1995.

P.G. Newman, J. Pamulapati, H. Shen, M. Taysing-Lara, J. Liu, W. Chang, G. Simonis, B. Koley, M. Dagenais, S. Feld, and J. Loehr, "Molecular beam epitaxial growth of vertical cavity surface emitting lasers with digital alloys and digital gradings," J. Vac. Sci. Technol. B, vol. 18, No. 3, pp. 1619-1622, May/Jun. 2000.

* cited by examiner

METHOD FOR SEMICONDUCTOR COMPOSITIONAL GRADING TO REALIZE LOW-RESISTANCE, DISTRIBUTED BRAGG REFLECTORS

PRIORITY

This application claims the benefit of priority to U.S. provisional patent application Ser. No. 60/548,502, filed Feb. 26, 2004.

GOVERNMENT INTERESTS

The United States Government has a paid-up license in this invention and the right in limited circumstances to require the patent owner to license others on reasonable terms as provided by the terms of Contract No. F29601-03-C-0030 awarded by the United States Air Force Research Laboratory.

BACKGROUND

1. Field of the Invention

The invention relates to distributed Bragg reflectors (DBRs), and particularly to a DBR manufactured with a compositional grading scheme and exhibiting low resistance.

2. Description of the Related Art

The need for increasing data-transfer capacity has led to the development of high-performance optoelectronic components, including vertical-cavity, surface-emitting lasers (VCSELs). VCSELs consist of an active region located between two highly-reflective mirrors, as shown in FIG. 1. Conventionally, these mirrors consist of alternating layers of semiconductor materials, each with a different refractive index, and of a specific thickness. This structure is known as a distributed Bragg reflector (DBR). Typically, VCSELs with semiconductor mirrors have DBRs with approximately 20 pairs of alternating layers within each reflector. The simplest form of DBR includes abrupt interfaces between the layers within the mirror. Abrupt interfaces involve changing of materials within a short distance from one material to another. For example, the DBRs shown in FIG. 1 show abrupt interfaces (or changes in material) between each of the mirror layers. The highly-reflective DBR results from the summation of reflections from each of the interfaces between the two layers. By choosing the thickness of each of the DBR layers to be an odd multiple of a quarter wavelength ($\square$) in the material ($\square$/4n), the summed reflections will add in phase to realize a highly reflective mirror. The most popular version of the DBR is the use of alternating layers of III-V semiconductors, such as $Al_xGa_{1-x}As$ and $Al_yGa_{1-y}As$ ($x \neq y$), for use in GaAs-based VCSELs operating a wavelengths such as 850 nm, 980 nm, or 1300 nm.

To realize high-performance VCSELs, the DBRs should be optimized to have both good electrical and optical properties. An optimized DBR will have a high optical reflectance, typically >99.9%, while having low optical loss. However, good electrical performance, e.g., having low electrical resistance, often requires changes in the DBR structure that will reduce the optical performance of the mirror. Thus, realizing a high performance VCSEL often involves a compromise between the electrical and optical performance of the mirror. One method to dramatically improve the electrical behavior, while keeping the doping low and only affecting the optical performance in a minor way, is to compositionally grade the materials at the interface between the two DBR materials. The grading scheme acts to reduce the device resistance to current (charge carrier) flow which translates into enhanced device performance characteristics, including reduced threshold voltages, higher output powers, and improved temperature-dependent behaviors. With the $Al_xGa_{1-x}As$ material system, this can be achieved due to the near lattice-matched conditions present for all compositions of $Al_xGa_{1-x}As$ on GaAs. The compositional grading reduces, or even eliminates, the magnitude of the energy band discontinuities present in the DBR structure. These discontinuities act as energy barriers preventing the flow of injected charge carriers, either electrons or holes, through the mirror, thus adding to the overall resistance of the DBR.

The functional shape of the compositional grading can also affect the resistance of the DBRs. Several different grading schemes, including linear and parabolic, have been successfully demonstrated resulting in low-resistance DBRs. [see references 1, 2, 3, below]. The linear grading scheme is simpler to implement and is commonly used in VCSELs. However, the more complicated parabolic grading scheme is also commonly used to flatten the valence band and further optimize device performance. Typically, linear grading schemes are employed in n-type DBRs, which use electrons as the charge carriers, while parabolic grading schemes are used in p-type mirrors, which employ holes as the charge carriers.

Several different ways of realizing compositional grading have been demonstrated. The method used depends on the growth apparatus used in the formation of the VCSEL structure. These include analog grading schemes realized using metal-organic, chemical vapor deposition (MOCVD) and digital superlattice grading schemes realized using molecular beam epitaxy (MBE). The method proposed here is realized with a multi-source configuration using MBE that results in a digital alloy-grading scheme providing a novel method for realizing low-resistance DBRs.

Analog Compositional Grading Schemes

MOCVD growth systems employ reactive gases, controlled by mass-flow controllers (MFCs), introduced on a heated single-crystal, semiconductor substrate to realize the controlled growth of semiconductor materials. By changing the type of reactive gases, flow rates, and the ratio of gas flows, the materials and their characteristics can be carefully tailored to result in high-performance devices.

Specific to the growth of DBRs is the method used for compositionally grading the interfaces between the materials in the mirror. Due to the nature of the control of MFCs, the flow rates of both the Ga- and Al-containing gases can be smoothly changed to result in an analog grading of the $Al_xGa_{1-x}As$ compositions over a small thickness, typically 10-20 nm. An increasing Al-composition can be realized by either reducing the Ga-containing gas flow rate, increasing the Al-containing gas flow rate, or simultaneously combining both. To decrease the Al-composition of the material, the opposite flow control can be used. Both linear and parabolic grading schemes can be easily realized using MOCVD. FIG. 2 shows a diagram of a linear and a parabolic grading scheme, as would be used in a $GaAs/Al_xGa_{1-x}As$ DBR, using MOCVD. For comparison, an abrupt grading scheme is also included. The horizontal regions (constant composition) are the alternating layers of the DBR. The graded regions (varying composition) represent the grading of the alloy composition between DBR pairs. The figure shows 3.5 pairs in a DBR and exaggerates the thickness of the graded regions to make the concept clearer. VCSELs, with high performance characteristics, have been demonstrated using these types of compositional grading scheme [see reference 4, below]. By programming the desired flow rate conditions into the MOCVD's controlling computer system, a reproducible compositional grading scheme can be realized throughout the DBR.

Digital Superlattice Grading Schemes

MBE has also been shown to be a successful method for realizing high performance VCSELs. MBE growth systems contain multiple elemental sources that supply a flux of atoms toward a heated, single-crystal, substrate to realize complicated semiconductor structures. The flux of these elemental sources is controlled by both the temperature of the source effusion cells and a shutter, placed in front of the source, which acts to block the flux of atoms when in the closed position. This different growth methodology presents challenges when trying to realize analog grading schemes, as described above, using MOCVD. The flux rate of a typical group-III elemental source is exponentially dependent on the temperature of the effusion cell. Thus, accurate, dynamic control of the flux can be problematic. Therefore, a digital method for realizing compositional grading is often employed in DBRs using MBE. This digital method employs a superlattice structure, consisting of thin layers (~1-10 nm) of GaAs and AlAs, which, on average, result in an $Al_xGa_{1-x}As$ alloy with an Al-composition (x) that is dependent on the thickness of the superlattice layers. For example, a superlattice grading scheme that has a 3 nm AlAs layer combined with a 7 nm GaAs layer would have an effective Al-composition (x) of 30%, while a superlattice with a 5 nm AlAs layer combined with a 5 nm GaAs layer would have an effective Al-composition (x) of 50%. The accurate control over layer thickness inherent in MBE allows these superlattice alloys to be realized by simply opening and closing the shutters for the Al- and Ga-elemental sources.

For use in DBRs, a superlattice alloy is used to grade the composition between the two materials in the mirror. By changing, or chirping, the thickness of the GaAs and AlAs layers (changing the ratio of Ga to Al atoms) present in the superlattice, the effective composition of the digital alloy can be tailored to reflect a linear or parabolic functional form. FIG. 3 shows the superlattice method for achieving compositional grading. The thicker horizontal regions (constant composition) represent the main layers within the DBR. The thin regions (varying composition) represent the digital superlattice grading region. The thickness of the graded (superlattice) region has been exaggerated for clarity. While this method offers significant advantages over the abrupt DBR design (no compositional grading) it has some drawbacks. The superlattice method of grading the composition often involves thousands of shutter openings and closings within the growth of a VCSEL. This will likely accelerate the failure of the shutters, and involve costly system maintenance. In addition, each of the multiple layers in the superlattice causes a discontinuity in the energy bands, thus increasing DBR resistance. However, the thickness of the layers within the superlattice is small enough to allow significant tunneling of carriers through these energy barriers, resulting in low-resistance DBRs using this method. In spite of these drawbacks, the superlattice grading scheme is commonly used in MBE and has been used to realize high-performance VCSELs with low mirror resistance and low threshold voltages. [see references 5, 6, below].

SUMMARY OF THE INVENTION

In accordance with a first aspect of the invention, a method of manufacturing a distributed Bragg reflector (DBR) in $A^{II}$-$B^V$ compounds with improved optical and electrical characteristics is provided. The method involves a growth apparatus containing multiple group III elements and a group V element, and including multiple sources of at least one of said multiple group-III elements ($A^{III}$) in the $A^{III}B^V$ compound, and which have selected flux rates. A selected DBR structure is achieved by sequential exposure of a substrate to predetermined combinations of the elemental sources to produce a pair of DBR layers of compound alloys and a graded region including one or more discrete additional layers between the DBR layers of intermediate alloy composition. Exposure durations and combinations of the elemental sources in each exposure are predetermined by DBR design characteristics.

In accordance with a second aspect, a method of manufacturing a distributed Bragg reflector (DBR) includes selective exposure to combinations of at least one group V element and multiple group III elements, including multiple sources of different flux rate of at least one of the group III elements. The exposures are selected to form DBR layers and one or more discrete additional layers with a substantially linear compositional grading scheme between the DBR layers. Alternatively, a selected non-linear compositional grading scheme may be provided between the DBR layers.

In accordance with a further aspect, a growth apparatus is provided for manufacturing a distributed Bragg reflector (DBR) in $A^{III}B^V$ compounds. The apparatus includes multiple sources of different flux rate of at least one group III element, at least one source of a second group III element, and at least one source of a group V element. A selected DBR structure is achievable by sequential exposure of a substrate to predetermined combinations of the sources to produce a pair of DBR layers of compound alloys and a graded region including one or more discrete additional layers between the DBR layers of intermediate alloy composition, when exposure durations and combinations of the elemental sources in each exposure are predetermined by DBR design characteristics.

In accordance with another aspect, a distributed Bragg reflector (DBR) includes alternating DBR layers of predetermined III-V or II-VI semiconductor alloy compositions and a graded region including one or more discrete additional layers of intermediate alloy composition between DBR layers.

In accordance with another aspect, a distributed Bragg reflector (DBR) includes a first DBR layer having a first composition of group III and group V elements, a second DBR layer having a second composition of group III and group V elements which is different from the first composition, and a third DBR layer having a third composition of group III and group V elements which is different from the first and second compositions. A further DBR is provided as above comprising group II and group VI elements instead of group III and group V elements.

In accordance with a further aspect, a method for fabricating a distributed Bragg reflector (DBR) includes providing multiple sources of at least one group-III element, each of the multiple sources being operable at a different flux rate, providing one or more sources of at least one other group-III element operable at a predetermined flux rate, and providing at least one source of a group-V element also operable at a predetermined flux rate. The method further includes selectively operating the group-III element sources and the group V source element source in a first combination to form a first DBR layer, selectively operating the group-III element sources and the group V source element source in a second combination to form a second DBR layer, and selectively operating the group-III element sources and the group V source element source in a third combination to form a third DBR layer, wherein the first, second and third compositions are different from one another. The method preferably, but not necessarily, includes one or more further selective operations in one or more different combinations to form one or more further layers of still different composition(s). A further method is provided as above involving group II and group VI elements instead of group III and group V elements.

In accordance with a further aspect, a method of manufacturing a distributed Bragg reflector (DBR) of III-V or II-VI semiconductor DBR layers of alternating composition having between them a compositionally-graded region including at least one additional layer of discrete intermediate composition. The method includes forming a first discrete III-V or II-VI semiconductor DBR layer of a first composition of multiple elements of a first group and at least one element of a second group, forming a second discrete III-V or II-VI semiconductor layer of a second composition, different than the first, of multiple elements of the first group and at least one element of the second group, and forming a third discrete III-V or II-VI semiconductor DBR layer including a third composition, different than each of the first and second, of multiple elements of the first group and at least one element of the second group. Steps (a)-(c) are repeated a selected number of times to complete the DBR. The first and third layers include the DBR layers of alternating composition and the second layer comprises a discrete additional layer formed between the DBR layers having an intermediate composition.

In accordance with another aspect, a method of manufacturing a distributed Bragg reflector (DBR) by deposition of III-V or II-VI semiconductor layers of alternating and intermediate composition is provided. The method includes generating multiple flux sources of different flux rates of a first element of a first III-V or II-VI semiconductor component group, generating one or more flux sources of a second element of the first III-V or II-VI semiconductor component group, and generating one or more flux sources of a second III-V or II-VI semiconductor component group. The method further includes exposing a substrate to a first flux composition by selective exposure to one or a combination of flux sources of the first element of the first group, one or a combination of flux sources of the second element of the first group and one or a combination of flux sources of the second group, to produce a first discrete III-V or II-VI semiconductor layer. After the first flux composition exposure to produce the first layer, the substrate is exposed to a second flux composition by selective exposure to a different one or combination of the flux sources of the first element of the first group, and a same or different one or combination of flux sources of the second element of the first group and a same or different one or combination of flux sources of the second group, to produce a second discrete III-V or II-VI semiconductor layer of different composition than the first layer. After the second flux composition exposure to produce the second layer, the substrate is exposed to a third flux composition by selective exposure to a still different one or combination of flux sources of the first element of the first group, and a still same or different one or combination of flux sources of the second element of the first group and a still same or different one or combination of flux sources of the second group, to produce a third discrete III-V or II-VI semiconductor layer of different composition than each of the first layer and the second layer. The first and third layers comprise the semiconductor DBR layers of alternating composition, and the second layer represents a discrete additional layer of intermediate composition between the first and third layers of a compositional grading scheme to realize a low-resistance DBR.

In accordance with any of the above aspects, the invention may preferably or alternatively include any of the following further features:

The growth apparatus may comprise a molecular beam epitaxy growth system. The $A^{III}B^V$ or group III-V compound may be an $Al_xGa_{1-x}As$ compound and the single-crystal substrate may be GaAs. The growth apparatus may include multiple sources of Al, and multiples sources of Ga. Multiple sources of each group III element may have different flux rates. Flux rates of each elemental source may be predetermined such that desirable contents of Al in the alloys can be achieved by proper exposure combinations of the elemental sources of Al and Ga. The desirable content of Al in an alloy may be adjustable and/or selectable between 0% and 100%. A non-linear grading scheme may include a substantially parabolic or bi-parabolic grading scheme. The substrate may be a single crystal substrate. Flux rates may be unchanged between exposures. Instead, flux compositions may be changed by shuttering different flux sources and/or changing which of the flux sources that the substrate is exposed to.

Elemental component combinations may particularly include, among others, the following:

Al, Ga and As;
Al, Ga and N;
In, Ga, As and P;
Al, Ga, Sb, In and P;
In, Al, Ga, As, Sb, and P;
Al, Ga, and Sb;
Al, Ga, Sb, In and As.

In further aspects, a DBR may be manufactured by any of the recited methods. A VCSEL, a resonant cavity light emitting diode, and/or a resonant cavity photodetector may include a DBR as recited above and/or as manufactured by any of the recited methods. Moreover, the DBR layers may have particularly preferred minimum thicknesses, e.g., not less than approximately five or ten Angstroms.

DETAILED DESCRIPTION OF THE PREFERRED EMBODIMENTS

Figure 1:
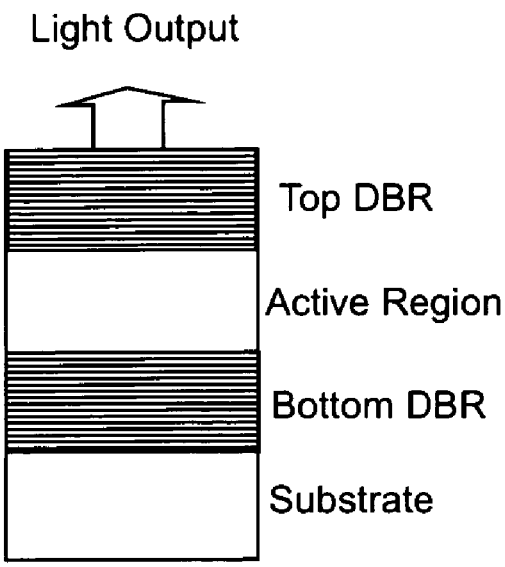
FIG. 1: Schematic of a VCSEL consisting of a top DBR, VCSEL cavity, and bottom DBR grown on a substrate. Note that the DBRs consist of many pairs of alternating layers to form a highly-reflective mirror for device operation.
Figure 2:
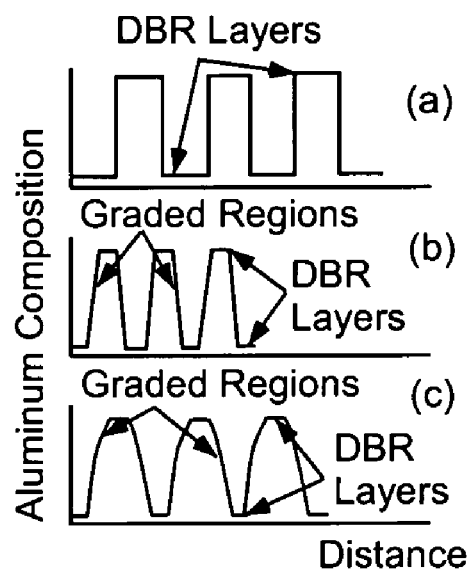
FIG. 2: Aluminum composition as a function of distance for several DBR periods using analog grading schemes, as utilized in MOCVD growth, for (a) an abrupt DBR, (b) a linearly graded DBR, and (c) a parabolically graded DBR.
Figure 3:
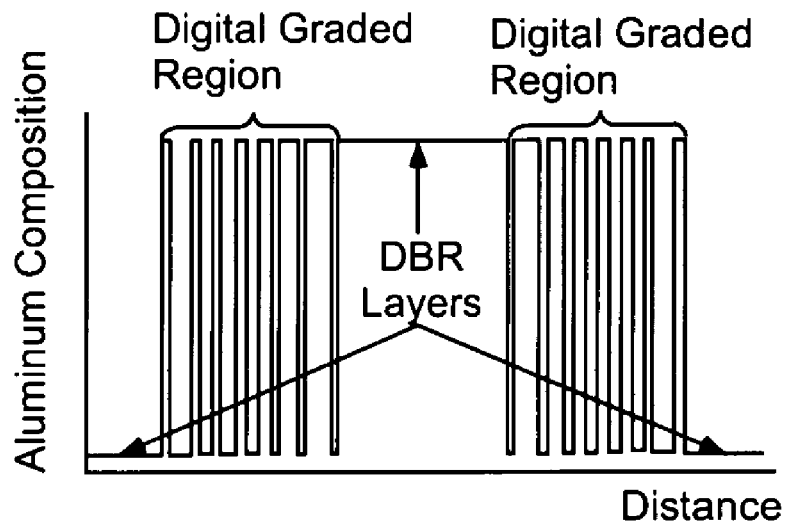
FIG. 3: Aluminum composition as a function of distance for several DBR periods using the digital, superlattice grading scheme as utilized in MBE growth. Notice the thickness of the individual layers within the superlattice change with position, thereby effectively changing the Al-composition of the digital alloy.
Figure 4:
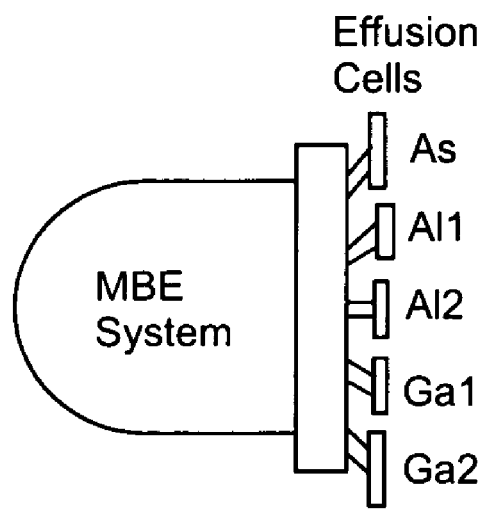
FIG. 4: Top view of an MBE crystal growth system using multiple group-III effusion cells (sources). Notice the presence of two aluminum and two gallium sources on the source shroud of the system.

The proposed method for compositional grading employs a concept, involving the combination of thin, discrete, layers, to realize a compositional grade. However, this method differs from the digital alloy scheme described above in that this process employs small layers, each with a different $Al_xGa_{1-x}As$ composition, to approximate an analog compositional grading scheme. This method uses MBE and requires a system with multiple group-III elemental sources, as shown in FIG. 4. For the purposes of this explanation, the MBE system is configured with three Al sources and two Ga sources. However, other multi-source configurations can be used to realize this novel process. This method can be used in multiple material systems, but for the purposes of this description, the $Al_xGa_{1-x}As$ material system will be used. Using various combinations of the elemental Ga- and Al-sources, each with a different flux rate, different $Al_xGa_{1-x}As$ compositions can be realized for use in the graded DBR structures. For example, an Al-source, Al1, could have a growth (flux) rate of 1.0 monolayers (ML) per second, another Al-source, Al2, could have a growth rate of 0.5 mL/s, and a Ga-source, Ga1, could have a growth rate of 1.5 mL/s. Combining cells Al1+ Ga1, and a sufficient amount of arsenic, would result in an Al-composition (x) of approximately 0.4, while a combination of Al2+Ga1 would result in an Al-composition of approximately 0.25. Since the $Al_xGa_{1-x}As$ composition is determined by the combination of sources, and not the ratio of the thicknesses of the layers (such as with the superlattice alloy), the thickness of the discrete layers can be changed to meet the design requirements. Thus, various thicknesses can be used for each of the discrete layers, to realize designs that closely approximate analog linear or parabolic grading schemes. In addition, the magnitude and number of the energy barriers (discontinuities) will be reduced, resulting in a reduction of DBR resistance.

For the purposes of this description, this design used three Al-sources, each at a different flux rate (wherein effusion cell temperature generally directly affects the flux rate, and wherein growth rates on the substrate generally track substantially directly with the overall elemental flux rates) and two Ga-sources, also at different flux rates. With different combinations of these elemental sources (shutters open or closed), over 20 different $Al_xGa_{1-x}As$ combinations are possible without changing any of the effusion cell temperatures (wherein in a thermal evaporation system, these effusion cell temperatures directly affect elemental flux rates; while for an e-beam deposition system, the same combinations are possible without changing any of the e-beam currents that energize the effusion cells; and note that other systems for forming DBRs may be used in accordance with the invention and/or preferred embodiment as may be understood by those skilled in the art). This allows for controllable and reproducible compositional grades, which aids greatly in manufacturing. To properly choose a set of flux rates for these five elemental cells, several iterations were studied. The goal of this design was to realize a large number of $Al_xGa_{1-x}As$ compositions, which were relatively evenly spaced in composition, were evenly distributed across the entire alloy compositional range, and had reasonable growth rates resulting from the combined fluxes. By choosing a fast, medium, and slow flux rate for the Al sources, and a fast and slow flux rate for the Ga sources, a useful set of possible $Al_xGa_{1-x}As$ combinations are available. The growth rates, ML/s, for the Al sources were chosen to be 0.7, 0.4 and 0.2 mL/s. The growth rates for the Ga sources were chosen to be 1.3 and 0.2 mL/s. Table 1 shows the available $Al_xGa_{1-x}As$ compositions using these flux rates along with their corresponding total growth rates. Note that the choices for composition are relatively evenly distributed over the entire compositional range.

TABLE 1

| Combination | Al Composition | Growth rate(ML/s) |
|---|---|---|
| Ga1 | 0 | 1.3 |
| Ga1 + Ga2 + Al3 | 0.1174 | 1.7 |
| Ga1 + Al3 | 0.133 | 1.5 |
| Ga1 + Ga2 + Al2 | 0.2101 | 1.9 |
| Ga1 + Al2 | 0.2348 | 1.7 |
| Ga1 + Ga2 + Al2 + Al3 | 0.2852 | 2.1 |
| Ga1 + Al2 + Al3 | 0.3152 | 1.9 |
| Ga1 + Ga2 + Al1 | 0.3176 | 2.2 |
| Ga1 + Al1 | 0.3494 | 2.0 |
| Ga1 + Ga2 + Al1 + Al3 | 0.3744 | 2.4 |
| Ga1 + Al1 + Al3 | 0.4085 | 2.2 |
| Ga1 + Ga2 + Al1 + Al2 | 0.4225 | 2.6 |
| Ga1 + Al1 + Al2 | 0.4577 | 2.4 |
| Ga1 + Ga2 + Al1 + Al2 + Al3 | 0.4636 | 2.8 |
| Ga2 + Al3 | 0.5 | 0.4 |
| Ga2 + Al2 | 0.6661 | 0.6 |
| Ga2 + Al2 + Al3 | 0.7495 | 0.8 |
| Ga2 + Al1 | 0.7773 | 0.9 |
| Ga2 + Al1 + Al3 | 0.8178 | 1.1 |
| Ga2 + Al1 + Al2 | 0.8458 | 1.3 |
| Ga2 + Al1 + Al2 + Al3 | 0.8664 | 1.5 |
| Al1 + Al2 + Al3 | 1.0 | 1.3 |

Table 1 shows aluminum compositions available using different combinations of Al- and Ga-fluxes in accordance with a preferred embodiment of the invention. Note that the available compositional choices are evenly spaced over a majority of the available compositions.

Figure 5:
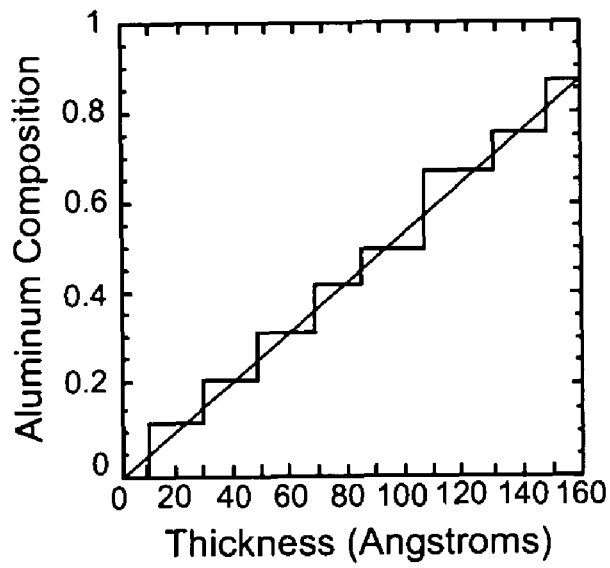
FIG. 5: Aluminum composition as a function of distance for the linear grading scheme using the proposed compositional grading method. Included on the plot is the true functional form for the linear grade.
Figure 6:
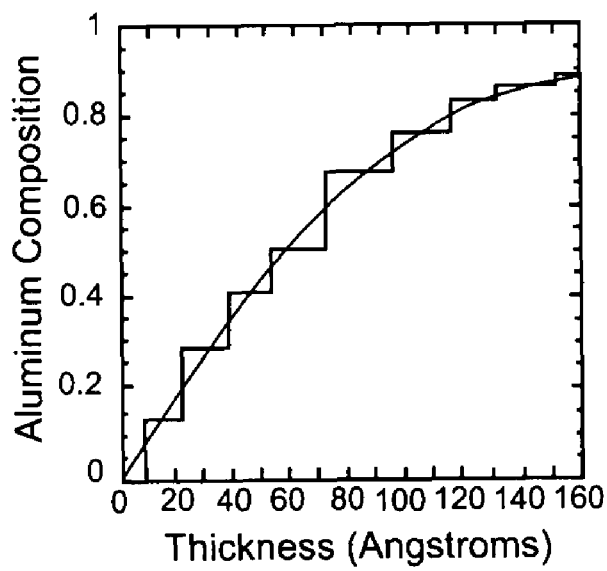
FIG. 6: Aluminum composition as a function of distance for the parabolic grading scheme using the proposed compositional grading method. Included on the plot is the true functional form for the parabolic grade.

Using the available $Al_xGa_{1-x}As$ compositions, a linear and a parabolic grading scheme were designed for use in a VCSEL. The thickness of each of the discrete layers within the DBRs was changed to allow for a close approximation of the true functional form for each of the grading schemes. The discrete layers within the mirrors are thin enough that the grading scheme is a close approximation to those grown using an analog grading method (MOCVD). FIG. 5 (linear) and FIG. 6 (parabolic) show the discrete compositional steps used in each of these designs. In addition, the true functional form for both grading schemes was included to show how closely the discrete grades approximate the true functional form. The plots shown in FIGS. 5-6 from exemplary data suggest that the layers may have thicknesses as low as about 10 Angstroms. However, it is understood that the discrete layers may have thicknesses as low as about five Angstroms. Below five Angstroms, it is generally difficult to form layers of known thickness and/or composition due to uncertainties in shutter open/close times. It is therefore preferred that any discrete layers of the graded region between DBR layers have a thickness of approximately five Angstroms or more. Of course, if a system being used to form a DBR may be operated to form the discrete layers with thicknesses somewhat below five Angstroms, such as four Angstroms, or three Angstroms, without these uncertainties, then such layer thicknesses would be sufficient.

Using the proposed methods described above, DBRs were fabricated and characterized to determine the resistance of both n- and p-type DBRs to prove the concept of the invention. The n-DBR test structure consisted of a 20 pair mirror structure grown on an n-type GaAs substrate. The test structure was capped with a highly-doped, n-type GaAs layer to facilitate electrical contacting. Similar methods were used to grow a p-type DBR structure on a p-type GaAs substrate with a highly p-doped contact layer. Modulated doping schemes were used in both test structures to further reduce DBR resistance. Using conventional fabrication techniques, the DBRs were patterned, etched, and electrically contacted to form DBRs with different diameters. Standard electrical testing was used to determine the current-voltage (I-V) and resistance behavior of the mirror structures.

Figure 7:
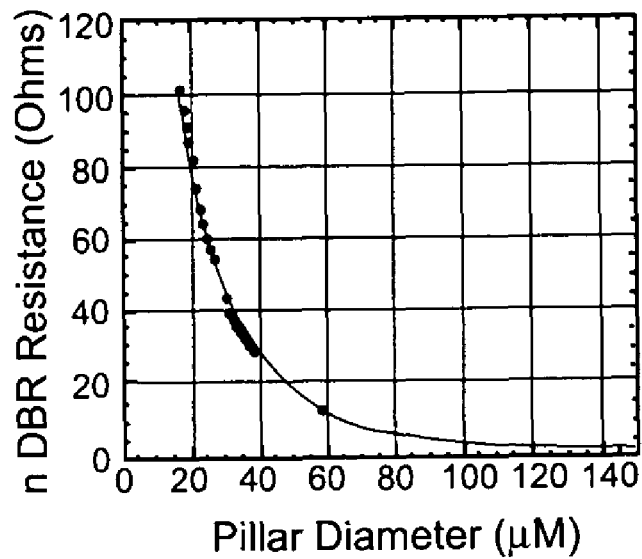
FIG. 7: N-type distributed Bragg reflector (DBR) resistance as a function of pillar diameter. Typical sizes for n-type DBRs are 40 μm giving a resistance of ~30Ω.
Figure 8:
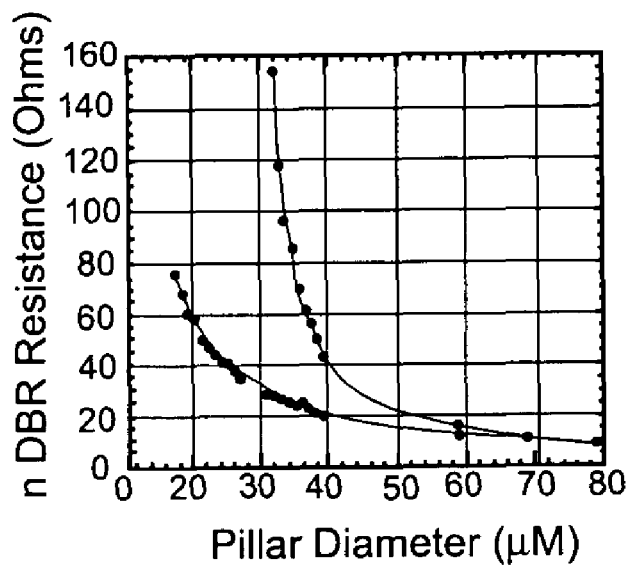
FIG. 8: P-type distributed Bragg reflector (DBR) resistance as a function of pillar diameter. The curve with the higher resistance values represents the DBRs with oxidized apertures.

FIG. 7 shows the measured resistance, as a function of DBR diameter, for the n-type mirrors. The resistance of these structures was low, measuring ~30Ω for typical DBR diameters of 40 μm. FIG. 8 shows the measured resistance as a function of DBR diameter for the p-type DBR mirrors. In addition, an oxide aperture was included in the p-DBR test structure to mimic their performance in VCSELs. Both sets of measured resistances were also low, similar to the n-type mirrors. For oxidized aperture sizes of 3-4 μm, DBR resistances of 100-120Ω were measured.

Figure 9:
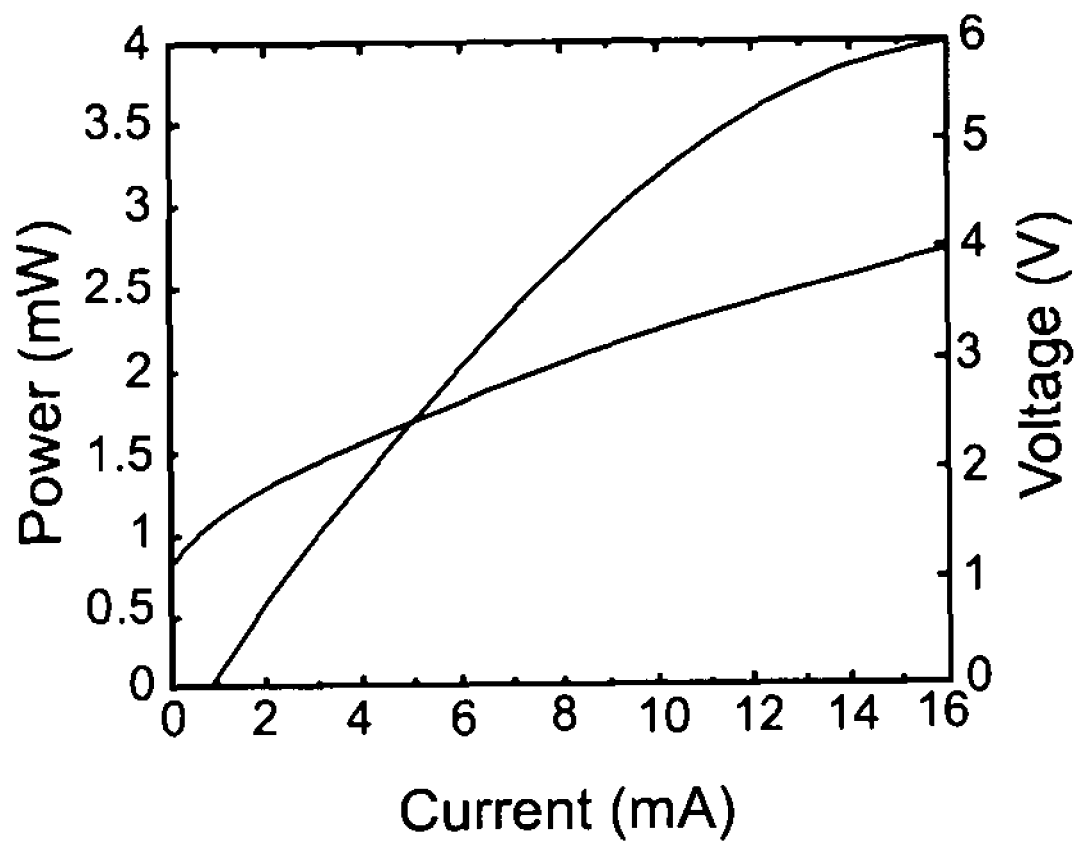
FIG. 9: The light-current-voltage (L-I-V) behavior of a VCSEL fabricated using the proposed compositional grading method. These devices had 6 μm aperture sizes. The threshold voltages for these devices were 1.5 V.

Based on the results of the DBR tests, VCSELs were fabricated and characterized to determine the effects of this method on device performance. A top-emitting device geometry was used employing a 30 pair n-type DBR, an $Al_xGa_{1-x}As$/GaAs cavity with three $In_xGa_{1-x}As$ quantum wells, a 40 nm oxide aperture period, and a 17 pair p-type DBR including a top, highly-doped, GaAs p-contact layer. N-type electrical contacts were deposited on the back of the n-type substrates, while a p-type, ring-shaped, contact was used for contacting the p-type DBR. A standard lateral oxidation process was used to form the current aperture in the p-type DBR. The performance of the VCSELs indicate that the proposed grading scheme significantly improved the performance of the devices, thus proving the concept of the invention. Threshold voltages of 1.5 V and resistances of ~100Ω (moderately sized devices) indicate that these devices have similar performance to the best reported in the literature [see reference 7, below]. FIG. 9 shows a typical light-current-voltage (LIV) performance for a VCSEL with a 6 μm aperture size.

Those skilled in the art can now appreciate from the foregoing description that the broad teachings of the present invention can be implemented in a variety of forms. For example, that which is described at the following references:

[1] M. G. Peters, B. J. Thibeault, D. B. Young, J. W. Scott, F. H. Peters, A. C. Gossard, and L. A. Coldren, "Band-gap engineered digital alloy interfaces for lower resistance vertical-cavity surface-emitting lasers," Appl. Phys. Lett., Vol. 63, no. 25, pp. 3411-3413, Dec. 20, 1993;

[2] P. Zhou, B. Lu, J. Cheng, K. J. Malloy, S. Z. Sun, S. D. Hersee, and J. C. Zolper, "Vertical-cavity surface-emitting lasers with thermally stable electrical characteristics," J. Appl. Phys., Vol. 77, No. 6, pp. 2264-2267, Mar. 15, 1995;

[3] B. Lu, P. Zhou, J. Cheng, K. J. Malloy, and J. C. Zolper, "High temperature pulsed and continuous-wave operation and thermally stable threshold characteristics of vertical-cavity surface-emitting lasers grown by metalorganic chemical vapor deposition," Appl. Phys. Lett., Vol. 65, No. 11, pp. 1337-1339, Sep. 12, 1994;

[4] P. Zhou, J. Cheng, C. F. Schaus, S. Z. Sun, K. Zheng, E. Armour, C. Hains, W. Hsin, D. R. Myers, and G. A. Vawter, "Low series resistance high-efficiency GaAs/AlGaAs vertical-cavity surface-emitting lasers with continuously graded mirrors grown by MOCVD," IEEE Phot. Tech. Lett., Vol. 3, No. 7, pp. 591-593, July 1991;

[5] K. Tai, L. Yang, Y. H. Wang, J. D. Wynn, and A. Y. Cho, "Drastic reduction of series resistance in doped semiconductor distributed Bragg reflectors for surface-emitting lasers," Appl. Phys. Lett., Vol. 56, No. 25, pp. 2496-2498, Jun. 18, 1990;

[6] P. G. Newman, J. Pamulapati, H. Shen, M. Taysing-Lara, J. Liu, W. Chang, G. Simonis, B. Koley, M. Dagenais, S. Feld, and J. Loehr, "Molecular beam epitaxial growth of vertical cavity surface emitting lasers with digital alloys and digital gradings," J. Vac. Sci. Technol. B, Vol. 18, No. 3, pp. 1619-1622, May/June 2000; and

[7] S. A. Chalmers, K. L. Lear, and K. P. Killeen, "Low resistance wavelength-reproducible p-type (Al,Ga)As distributed Bragg reflectors grown by molecular beam epitaxy," Appl. Phys. Lett., Vol. 62, No. 14, pp. 1585-1587, Apr. 5, 1993, as well as the background, invention summary, brief description of the drawings and abstract, is hereby incorporated by reference as disclosing alternative features that may be combined into alternative embodiments of the invention. Therefore, while this invention has been described in connection with particular examples, the true scope of the invention should not be limited to these since other modifications will become apparent to the skilled practitioner upon a study of the drawings, specifications, and following claims.

What is claimed is:

1. A method of manufacturing a distributed Bragg reflector (DBR) in $A^{III}B^V$ compounds with improved optical and electrical characteristics, which involves a growth apparatus containing multiple group III elements and a group V element, and including multiple sources of at least one of said multiple group-III elements ($A^{III}$) in the $A^{III}B^V$ compound, and which have selected flux rates, wherein the method includes forming a selected DBR structure by sequential exposure of a substrate to predetermined combinations of the elemental sources to produce a pair of DBR layers of compound alloys and a graded region including one or more discrete additional layers between the DBR layers of intermediate alloy composition, wherein exposure durations and combinations of the elemental sources in each exposure are predetermined by DBR design characteristics, and forming at least one of the one or more discrete additional layers with a combination of at least two of the multiple sources of the at least one of the multiple group III elements to have a uniform composition.

2. The method of claim 1, wherein the growth apparatus comprises a molecular beam epitaxy growth system.

3. The method of claim 1, wherein the $A^{III}B^V$ compound is a $Al_xGa_{1-x}As$ compound and the substrate is a single-crystal GaAs substrate.

4. The method of claim 3, wherein the growth apparatus comprises multiple sources of Al, and multiple sources of Ga.

5. The method of claim 4, wherein multiple sources of each group III element have different flux rates.

6. The method of claim 5, wherein flux rates of each elemental source are predetermined such that desirable contents of Al in the alloys can be achieved by proper exposure combinations of the elemental sources of Al and Ga.

7. The method of claim 6, wherein the desirable content of Al in an alloy is adjustable between 0% and 100%.

8. The method of claim 1, wherein the substrate is a heated substrate.

9. The method of claim 1, wherein the substrate is a single crystal substrate.

10. A method of manufacturing a distributed Bragg reflector (DBR), comprising forming layers by selective exposure to combinations of at least one group V element and multiple group III elements, including multiple sources of different flux rate of at least one of the group III elements, wherein the exposures are selected to form DBR layers and one or more discrete additional layers with a substantially linear compositional grading scheme between the DBR layers, and forming at least one of the one or more discrete additional layers with a combination of at least two of the multiple sources of the at least one of the group III elements to have a uniform composition.

11. A method of manufacturing a distributed Bragg reflectors (DBR), comprising forming layers by selective exposure to combinations of at least one group V element and multiple group III elements, including multiple sources of different flux rate of at least one of the group III elements, wherein the exposures are selected to form DBR layers and one or more discrete additional layers with a non-linear compositional grading scheme between the DBR layers, and forming at least one of the one or more discrete additional layers with a combination of at least two of the multiple sources of the at least one of the group III elements to have a uniform composition.

12. A DBR manufactured by the process recited at any of claim 1, 10 or 11.

13. A VCSEL comprising an active region and a pair of DBRs, wherein at least one of the DBRs is manufactured by the process recited at any of claim 1, 10 or 11.

14. A resonant cavity light emitting diode comprising a DBR manufactured by the process recited at any of claim 1, 10 or 11.

15. A resonant cavity photodetector comprising a DBR manufactured by the process recited at any of claim 1, 10 or 11.

16. A growth apparatus for manufacturing a distributed Bragg reflector (DBR) in $A^{III}B^{V}$ compounds, comprising multiple sources of different flux rate of at least one group III element, at least one source of a second group III element, and at least one source of a group V element, wherein a selected DBR structure is achievable by sequential exposure of a substrate to predetermined combinations of the sources to produce a pair of DBR layers of compound alloys and a graded region including one or more discrete additional layers between the DBR layers of intermediate alloy composition, when exposure durations and combinations of the elemental sources in each exposure are predetermined by DBR design characteristics.

17. The apparatus of claim 16, wherein the growth apparatus comprises a molecular beam epitaxy growth system.

18. A method for fabricating a distributed Bragg reflector (DBR) comprising the steps of:
  (a) providing multiple sources of at least one group-III element, each of the multiple sources being operable at a different flux rate;
  (b) providing one or more sources of at least one other group-III element operable at a predetermined flux rate;
  (c) providing at least one source of a group-V element also operable at a predetermined flux rate;
  (d) selectively operating the group-III element sources and the group V element source in a first combination to form a first DBR layer of a first uniform composition;
  (e) selectively operating the group-III element sources and the group V element source in a second combination to form a second DBR layer of a second uniform composition; and
  (f) selectively operating the group-III element sources and the group V element source in a third combination to form a third DBR layer of a third uniform composition, wherein the first, second and third compositions are different from one another, and
  including forming at least one of the first, second or third layers with a combination of at least two of the multiple sources of the at least one group-III element.

19. The method of claim 18, further comprising selectively operating the group-III element sources and the group V source element source in a fourth combination to form a fourth DBR layer of a fourth composition, wherein the fourth composition is different than the first, second or third compositions.

20. The method of claim 19, further comprising multiple further selective operations in different combinations to form further layers of still different compositions.

21. The method of claim 20, wherein the method comprises molecular beam epitaxy.

22. The method of claim 20, wherein the further operations are selected to form a substantially linear grading scheme between DBR layers.

23. The method of claim 20, wherein the further operations are selected to form a non-linear grading scheme between DBR layers.

24. A DBR manufactured by the process recited at claim 18.

25. A VCSEL comprising an active region and a pair of reflectors, wherein at least one reflector comprises a DBR manufactured by the process recited at claim 18.

26. A resonant cavity light emitting diode comprising a DBR manufactured by the process recited at claim 18.

27. A resonant cavity photodetector comprising a DBR manufactured by the process recited at claim 18.

28. A method of manufacturing a distributed Bragg reflector (DBR) of III-V or II-VI semiconductor DBR layers of alternating composition having between them a compositionally-graded region including at least one additional layer of discrete intermediate composition, comprising:
  (a) forming a first discrete III-V or II-VI semiconductor DBR layer of a first uniform composition of multiple elements of a first group and at least one element of a second group;
  (b) forming a second discrete III-V or II-VI semiconductor layer of a second uniform composition, different than the first, of multiple elements of the first group and at least one element of the second group;
  (c) forming a third discrete III-V or II-VI semiconductor DBR layer including a third uniform composition, different than each of the first and second, of multiple elements of the first group and at least one element of the second group; and
  (d) repeating steps (a)-(c) a selected number of times to complete said DBR, and
  (e) wherein the first and third layers comprise the DBR layers of alternating composition and the second layer comprises a discrete additional layer formed between the DBR layers having an intermediate composition, and further wherein the first layer forming step comprises exposing a substrate to a first combination of flux sources selected from multiple sources of a first element of a first group, one or more sources of a second element of the first group, and one or more sources a second group, the second layer forming step comprising exposing the substrate to a second combination different that the first, and the third layer forming step comprising exposing the substrate to a third combination different than the first and second.

29. The method of claim 28, wherein the method comprises a molecular beam epitaxy growth process.

30. The method of claim 28, wherein the $A^{III}B^{V}$ compound is a $Al_xGa_{1-x}As$ compound and the substrate is GaAs.

31. The method of claim 28, wherein the flux sources include multiple sources of the second element of the first group, and wherein the first element of the first group comprises Al, and the second element of the first group comprises Ga.

32. The method of claim 31, wherein the multiple sources of each group III element have different flux rates.

33. The method of claim 32, wherein flux rates of each elemental source are predetermined such that desirable contents of Al in the alloys are achieved by predetermined exposure combinations of the elemental sources of Al and Ga.

34. The method of claim 33, wherein the desirable content of Al in an alloy is adjustable between 0% and 100%.

35. The method of claim 28, wherein the second layer forming step comprises forming one or more discrete additional layers each of a different uniform selected intermediate alloy composition to form a substantially linear compositional grading scheme.

36. The method of claim 28, wherein the second layer forming step comprises forming one or more discrete additional layers each of a different uniform selected intermediate alloy composition to form a non-linear compositional grading scheme.

37. A DBR manufactured by the process recited at claim 28.

38. A VCSEL comprising an active region and a pair of reflectors, wherein at least one reflector comprises a DBR manufactured by the process recited at claim 28.

39. A resonant cavity light emitting diode comprising a DBR manufactured by the process recited at claim 28.

40. A resonant cavity photodetector comprising a DBR manufactured by the process recited at claim 28.

41. A method of manufacturing a distributed Bragg reflector (DBR) by deposition of III-V or II-VI semiconductor layers of alternating and intermediate composition, comprising:
(a) generating multiple flux sources of different flux rates of a first element of a first III-V or II-VI semiconductor component group;
(b) generating one or more flux sources of a second element of the first III-V or II-VI semiconductor component group;
(c) generating one or more flux sources of a second III-V or II-VI semiconductor component group;
(d) exposing a substrate to a first flux composition by selective exposure to one or a combination of flux sources of the first element of the first group, one or a combination of flux sources of the second element of the first group and one or a combination of flux sources of the second group, to produce a first discrete III-V or II-VI semiconductor layer;
(e) after the first flux composition exposure to produce the first layer, exposing the substrate to a second flux composition by selective exposure to a different one or combination of the flux sources of the first element of the first group, and a same or different one or combination of flux sources of the second element of the first group and a same or different one or combination of flux sources of the second group, to produce a second discrete III-V or II-VI semiconductor layer of different composition than the first layer; and
(f) after the second flux composition exposure to produce the second layer, exposing the substrate to a third flux composition by selective exposure to a still different one or combination of flux sources of the first element of the first group, and a still same or different one or combination of flux sources of the second element of the first group and a still same or different one or combination of flux sources of the second group, to produce a third discrete III-V or II-VI semiconductor layer of different composition than each of the first layer and the second layer, and
(g) wherein the first and third layers comprise the semiconductor DBR layers of alternating composition, and the second layer represents a discrete additional layer of intermediate composition between the first and third layers of a compositional grading scheme to realize a low-resistance DBR, and including forming at least one of the first, second or third layers with a combination of at least two of the multiple flux sources of the first element of the first III-V or II-VI semiconductor component group to have a uniform composition.

42. The method of claim 41, further comprising after the second flux composition exposure to produce the second layer and before the third flux composition exposure to produce the third layer, exposing the substrate to a fourth flux composition by selective exposure to a still different one or combination of the first component flux sources and a still same or different one or combination of the one or more further component flux sources to produce a fourth III-V or II-VI semiconductor layer of different composition than each of the first layer, the second layer and the third layer.

43. The method of claim 41, wherein the flux compositions are changed by shuttering different flux sources.

44. The method of claim 43, wherein the flux rates are unchanged between the first and second exposures.

45. The method of claim 44, wherein the flux rates are unchanged between the second and third exposures.

46. The method of claim 41, wherein the first and second flux compositions are changed by changing which of the flux sources that the substrate is exposed to.

47. The method of claim 46, wherein the flux rates are unchanged between the first and second exposures.

48. The method of claim 41, wherein the first and further components are components of a III-V semiconductor compound.

49. The method of claim 48, wherein the first and further components comprise Al, Ga and As.

50. The method of claim 48, wherein the first and further components comprise Al, Ga and N.

51. The method of claim 48, wherein the first and further components comprise In, Ga, As and P.

52. The method of claim 48, wherein the first and further components comprise Al, Ga, Sb, In and P.

53. The method of claim 48, wherein the first and further components comprise In, Al, Ga, As, Sb, and P.

54. The method of claim 48, wherein the first and further components comprise Al, Ga, and Sb.

55. The method of claim 48, wherein the first and further components comprise Al, Ga, Sb, In and As.

56. The method of claim 41, wherein the method comprises molecular beam epitaxy.

57. The method of claim 41, further comprising multiple further exposures to still different flux compositions by selective exposure to different ones or combinations of flux sources between the first and third flux composition exposures.

58. The method of claim 57, wherein the exposures are selected to form a substantially linear grading scheme.

59. The method of claim 57, wherein the exposures are selected to form a non-linear grading scheme.

60. A DBR manufactured by the process recited at claim 41.

61. A VCSEL comprising an active region and a pair of reflectors, wherein at least one reflector comprises a DBR manufactured by the process recited at claim 41.

62. A resonant cavity light emitting diode comprising a DBR manufactured by the process recited at claim 41.

63. A resonant cavity photodetector comprising a DBR manufactured by the process recited at claim 41.

64. A method for fabricating a distributed Bragg reflector (DBR) comprising the steps of:
    (a) providing multiple sources of at least one group-II element, each of the multiple sources being operable at a different flux rate;
    (b) providing one or more sources of at least one other group-II element operable at a predetermined flux rate;
    (c) providing at least one source of a group-VI element also operable at a predetermined flux rate;
    (d) selectively operating the group-II element sources and the group VI source element source in a first combination to form a first DBR layer of a first uniform composition;
    (e) selectively operating the group-II element sources and the group VI source element source in a second combination to form a second DBR layer of a second uniform composition; and
    (f) selectively operating the group-II element sources and the group VI source element source in a third combination to form a third DBR layer of a third uniform composition, wherein the first, second and third compositions are different from one another,
    including forming at least one of the one or more of the first, second or third DBR layer with a combination of at least two of the multiple sources of the at least one group-II element.

65. The method of claim 64, further comprising selectively operating the group-II element sources and the group VI source element source in a fourth combination to form a fourth DBR layer, wherein the fourth composition is different than the first, second or third compositions.

66. The method of claim 65, further comprising multiple further selective operations in different combinations to form further layers of still different compositions.

67. The method of claim 66, wherein the method comprises molecular beam epitaxy.

68. The method of claim 66, wherein the further operations are selected to form a substantially linear grading scheme between DBR layers.

69. The method of claim 66, wherein the further operations are selected to form a non-linear grading scheme between DBR layers.

70. A DBR manufactured by the process recited at claim 64.

71. A VCSEL comprising an active region and a pair of reflectors, wherein at least one reflector comprises a DBR manufactured by the process recited at claim 64.

72. A resonant cavity light emitting diode comprising a DBR manufactured by the process recited at claim 64.

73. A resonant cavity photodetector comprising a DBR manufactured by the process recited at claim 64.

74. The method of any of claim 11, 23, 36, 59, or 69, wherein the non-linear grading scheme comprises a substantially parabolic grading scheme.

75. The method of any of claim 11, 23, 36, 59, or 69, wherein the non-linear grading scheme comprises a substantially bi-parabolic grading scheme.

76. The method of any of claim 18 or 64, wherein the first, second and third DBR layers have thicknesses not less than approximately five Angstroms.

77. The method of any of claim 1, 10, 11, 28 or 41, wherein the one or more discrete additional layers have thicknesses not less than approximately five Angstroms.

78. The method of any of claim 18 or 64, wherein the first, second and third DBR layers have thicknesses not less than approximately ten Angstroms.

79. The method of any of claim 1, 10, 11, 28 or 41, wherein the one or more discrete additional layers have thicknesses not less than approximately ten Angstroms.

* * * * *